(12) United States Patent
Taunier et al.

(10) Patent No.: US 8,741,685 B2
(45) Date of Patent: Jun. 3, 2014

(54) SULFURIZATION AND SELENIZATION OF ELECTRODEPOSITED CIGS FILMS BY THERMAL ANNEALING

(75) Inventors: Stéphane Taunier, San Diego, CA (US); Daniel Lincot, Antony (FR); Jean-Francois Guillemoles, Paris (FR); Negar Naghavi, Paris (FR); Denis Guimard, Paris (FR)

(73) Assignees: Electricite de France, Paris (FR); Centre National de la Recherche Scientifique-CNRS, Paris (FR)

( * ) Notice: Subject to any disclaimer, the term of this patent is extended or adjusted under 35 U.S.C. 154(b) by 479 days.

(21) Appl. No.: 11/915,576

(22) PCT Filed: May 19, 2006

(86) PCT No.: PCT/FR2006/001149
§ 371 (c)(1),
(2), (4) Date: Nov. 26, 2007

(87) PCT Pub. No.: WO2006/125898
PCT Pub. Date: Nov. 30, 2006

(65) Prior Publication Data
US 2009/0130796 A1   May 21, 2009

(30) Foreign Application Priority Data
May 25, 2005 (FR) ....................... 05 05277

(51) Int. Cl.
*H01L 21/00* (2006.01)
(52) U.S. Cl.
USPC ................................. 438/94; 438/95; 438/84
(58) Field of Classification Search
USPC ............................................................. 438/94
See application file for complete search history.

(56) References Cited

U.S. PATENT DOCUMENTS 5,578,503 A * 11/1996 Karg et al. .................... 438/95
5,804,054 A * 9/1998 Bhattacharya et al. ...... 205/239
(Continued)

FOREIGN PATENT DOCUMENTS

| FR | 2 849 450 | 7/2004 |
|----|-----------|--------|
| FR | 2 849 532 | 7/2004 |

(Continued)

OTHER PUBLICATIONS

Nadenau, V. et al., "Solar Cells Based on $CuInSe_2$ and Related Compoounds: Material and Device Properties and Processing," *Progress in Photovoltaics: Research and Applications*, vol. 3, No. 6, 2005.
Preliminary Search Result for FR 0505277, dated Feb. 14, 2006.
International Search Result for PCT/FR2006/001149, dated Aug. 24, 2006.

*Primary Examiner* — David Vu
*Assistant Examiner* — Jonathan Han
(74) *Attorney, Agent, or Firm* — Marshall, Gerstein & Borun LLP

(57) ABSTRACT

The invention relates to a method for production of thin layers of semiconductor alloys of the $I-III-VI_2$ type, including sulphur, for photovoltaic applications, whereby a heterostructure is firstly deposited on a substrate comprising a thin layer of precursor $I-III-VI_2$ which is essentially amorphous and a thin layer, including at least some sulphur, the heterostructure is then annealed to promote the diffusion of the sulphur into the precursor layer and the at least partial crystallization of the $I-III-VI_2$ alloy of the precursor layer with a stoichiometry which hence includes sulphur. A layer of selenium may also be deposited to assist the recrystallization processes or annealing.

22 Claims, 5 Drawing Sheets

(56) References Cited

U.S. PATENT DOCUMENTS

| | | | | |
|---|---|---|---|---|
| 5,981,868 A | * | 11/1999 | Kushiya et al. | 136/262 |
| 6,274,805 B1 | * | 8/2001 | Nakazawa et al. | 136/256 |
| 6,323,417 B1 | * | 11/2001 | Gillespie et al. | 136/262 |
| 7,019,208 B2 | * | 3/2006 | Delahoy | 136/252 |
| 2005/0215079 A1 | * | 9/2005 | Taunier et al. | 438/796 |
| 2006/0084196 A1 | | 4/2006 | Taunier et al. | |
| 2006/0151331 A1 | | 7/2006 | Taunier et al. | |

FOREIGN PATENT DOCUMENTS

| | | |
|---|---|---|
| WO | WO-03/094246 A1 | 11/2003 |
| WO | WO 03094246 A1 * | 11/2003 |

\* cited by examiner

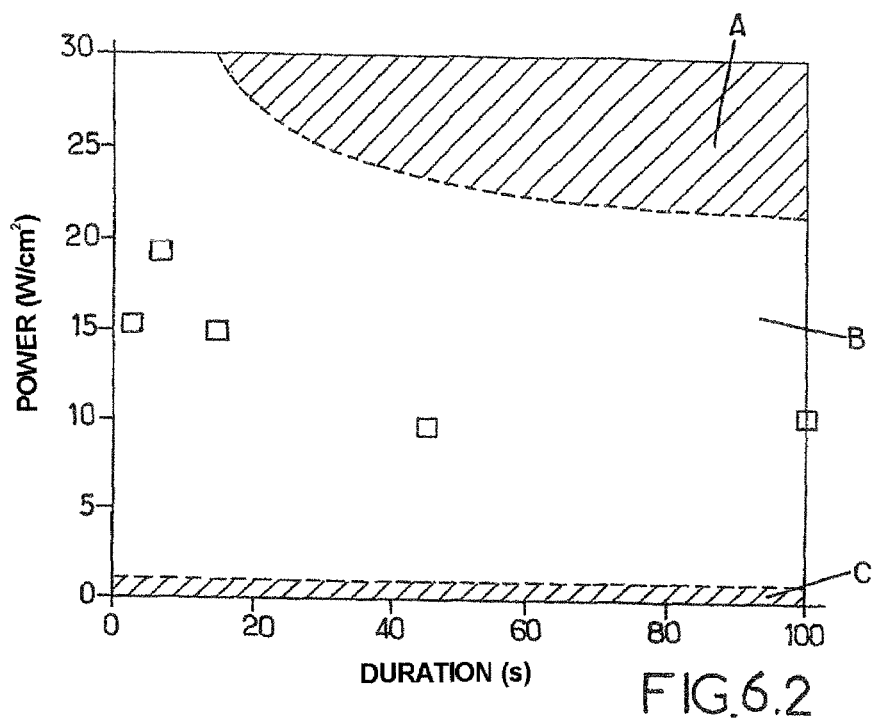
FIG.6.2
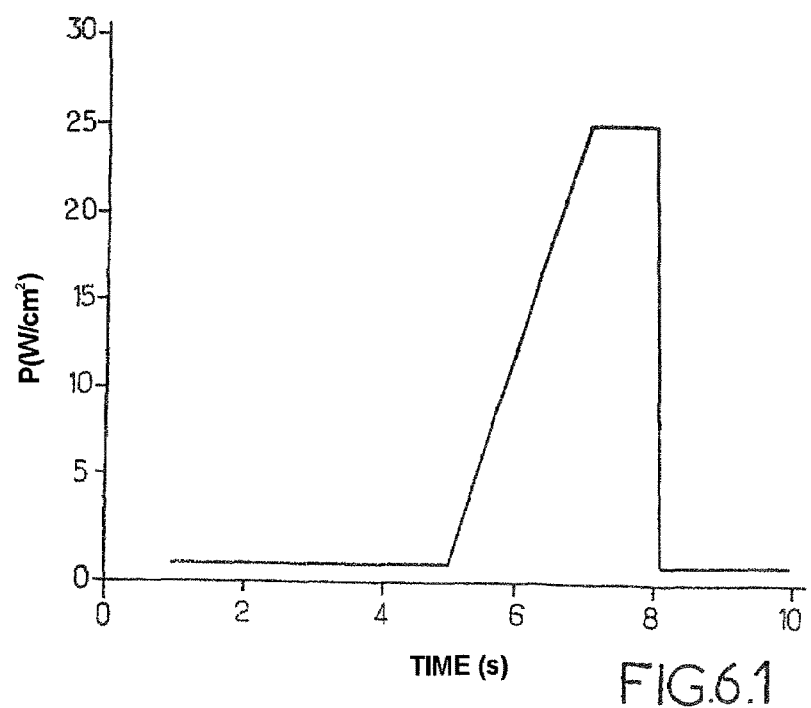
FIG.6.1

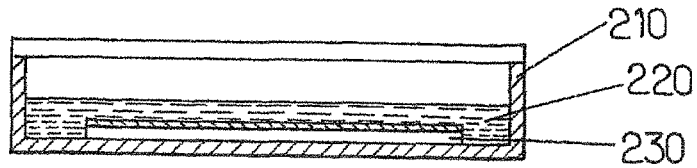
FIG.9.
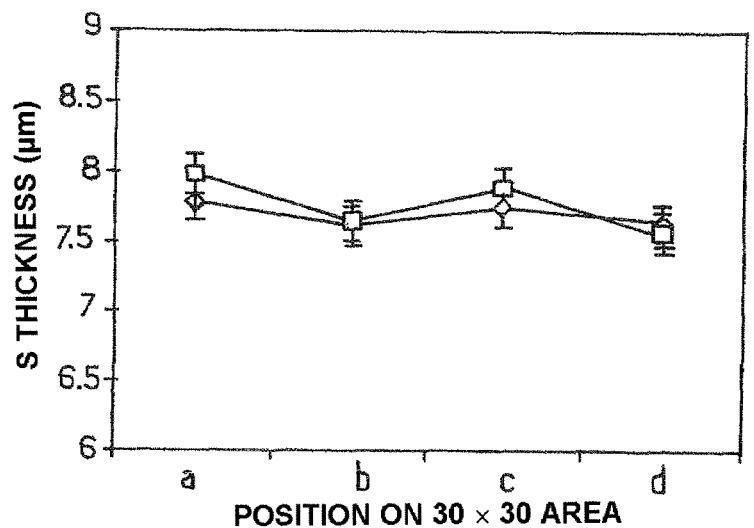
FIG.10.1
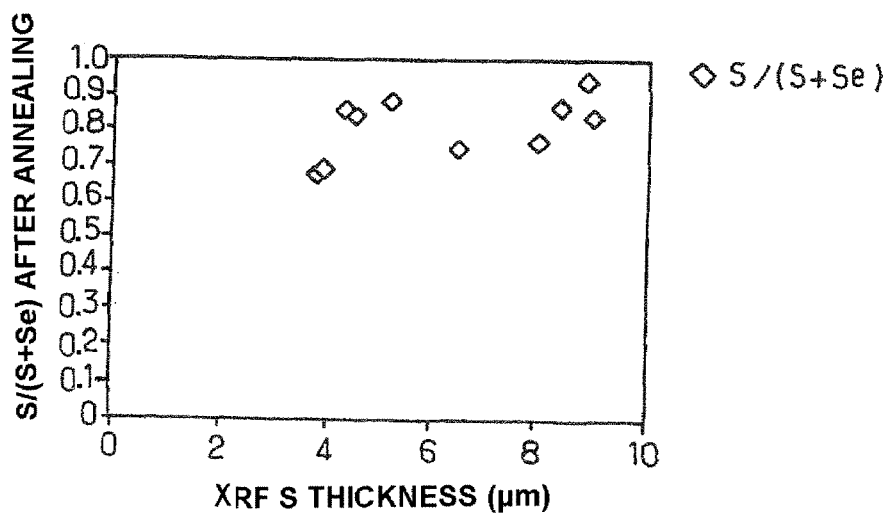
FIG.10.2

SULFURIZATION AND SELENIZATION OF ELECTRODEPOSITED CIGS FILMS BY THERMAL ANNEALING

FIELD OF THE INVENTION

The present invention relates to the field of thin-film deposition of semiconductors for photovoltaic applications.

BACKGROUND OF THE INVENTION

Thin films of copper indium gallium diselenide and/or disulfide and copper indium diselenide and/or disulfide (called CIGS and CIS) are deposited on a substrate in order to produce photovoltaic cells. Such compounds, of general formula $CuGA_xIn_{1-x}Se_{2-y}S_y$ (where x is between 0 and 1 and y is between 0 and 2), denoted by CIGSSe, are considered as very promising and could constitute the next generation of thin-film solar cells. CIGSSe semiconductor materials have a wide direct bandgap that may be set between 1.0 and 2.5 eV, thereby allowing optimum solar radiation absorption within the solar radiation range. Record conversion efficiencies of 19.5% have been recently obtained on small-area cells. The CIGSSe compounds are also called $I-III-VI_2$ compounds, with reference to the chemical nature of their constituents, in which:

the element Cu represents an element of column I (column 1B of the Periodic Table of the Elements);

the element In and/or the element Ga represent elements of column III (column 3B of the Periodic Table of the Elements); and the element Se and/or the element S represent an element of column VI (column 6B of the Periodic Table of the Elements).

There are therefore approximately two atoms from column VI for one atom of column I and one atom of column III in the single-phase range around the $I-III-VI_2$ composition of the CIGS.

The CIGS films used for photovoltaic conversion must have a p-type semiconductor character and good charge transport properties. These charge transport properties are favored by good crystallinity. Thus, CIGS compounds must be at least partially crystalline in order to possess photovoltaic properties sufficient for their application in the production of solar cells. Crystalline CIGS compounds have a crystallographic structure corresponding to the chalcopyrite system or the sphalerite system, depending on the deposition temperature. A process for fabrication such semiconductors is known from the application WO 03/094246.

Chalcopyrite materials, such as for example of the $Cu(In,GA)(S,Se)_2$ type have bandgap widths varying between 1.0 eV for $CuInSe_2$ and 2.4 eV for $CuGaS_2$. The solar cells having the highest efficiencies and the commercialized modules are prepared from absorbers with Ga/(Ga+In) ratios between 25 and 30%, corresponding to bandgaps of 1.12 eV. The use of solar cells based on absorbers having a wider bandgap has two advantages: firstly, they are close to the optimum value of 1.5 eV for solar spectrum absorption and secondly, for a module application, the series resistance losses are reduced for high voltages and low currents.

Starting from $CuInSe_2$ absorbers, it is possible to increase the width of the bandgap by substituting indium and/or selenium atoms with gallium and/or sulfur atoms respectively. The current record cells, having efficiencies of 18%, are obtained by substituting about 30% of the indium atoms with gallium atoms.

It is also possible to increase the bandgap of $CuInSe_2$ by replacing some of the selenium atoms with sulfur atoms. This process will be called hereafter "$CuInSe_2$ sulfurization process".

The sulfurization of metallic or binary precursors has been described. In V. Alberts and F. D. Dejene, Journal of Physics D: Appl. Phys. 35, 2021-2025, (2002) for example, the sulfurization takes place under a pressure of elemental sulfur at high temperatures, below the softening point of glass (600° C.). In K. Siemer, J. Klaer, I. Luck, J. Bruns, R Klenk and D. Braünig, Solar Energy Materials and Solar Cells, 67, 159-166, (2001), a rapid thermal process (RTP) is used to anneal the Cu—In metal precursors at 600° C. for three minutes (total annealing plan) and with rates of temperature rise of around 10° C./s. The substrate is placed in a quartz chamber and the elemental sulfur is placed beside the substrate. A vacuum is created in the chamber before annealing. The pressure during the annealing is then the saturation pressure of sulfur.

There are other sulfurization methods for obtaining thin films of semiconductors having optimum bandgaps, such as for example the one described in document U.S. Pat. No. 5,730,852. A film of precursor having the composition $Cu_xIn_yGa_zSe_n$ (where x, y and z are between 0 and 2 and n is between 0 and 3), using a pulsed-current method. This step is followed by a step of depositing a film of Cu+Se or In+Se elements by vacuum evaporation. A final annealing step allows the homogeneity and the quality of the resulting film to be improved.

However, these methods either involve toxic substances, implying severe constraints on the processes (use of an $H_2S$ or $H_2Se$ atmosphere) or do not allow the bandgap width to be finely controlled. They also require a vacuum step.

Moreover, when a VI element is used in its solid form (for example sulfur or selenium in powder form) close to the CIGS precursor, problems of heterogeneity of this element may arise.

OBJECTS AND SUMMARY OF THE INVENTION

The present invention allows the drawbacks of the known sulfurization techniques to be remedied.

For this purpose, the invention provides a process for fabricating thin films of semiconductor alloys of the $I-III-VI_2$ type that includes sulfur, for photovoltaic applications, in which:

a) a heterostructure, comprising a thin film of substantially amorphous $I-III-VI_2$ precursor and a thin film including at least sulfur is deposited on a substrate; and b) the heterostructure is annealed in order to favor both:
diffusion of the sulfur into the precursor film and
at least partial crystallization of the $I-III-VI_2$ alloy of the said precursor film with a stoichiometry thus including sulfur.

The diffusion of sulfur into a thin CIGS film thus makes it possible to obtain a desired bandgap width, in particular by varying the thickness of the film that includes sulfur.

The term "substantially amorphous" in step a) is understood to mean the fact that the morphology of the CIGS precursor film consists of nanocrystals joined together by an amorphous phase. After the annealing step, these nanocrystals grow in size and may reach sizes of the order of one micron.

In a preferred embodiment, the annealing carried out is "rapid" annealing. Typically, this may be annealing using high-power lamps, the power being transmitted to the films over a short period of time (less then a few tens of seconds).

In one advantageous embodiment, the thin film containing at least sulfur and optional additional films of selenium are deposited by chemical bath deposition (CBD).

Thus, the present invention makes it possible to solve the problems posed by the known sulfurization or selenization methods. There is therefore no use of an $H_2S$ or $H_2Se$ atmosphere, nor use of sulfur or selenium in powder form placed close to the substrate.

BRIEF DESCRIPTION OF THE DRAWINGS

Other features and advantages of the invention will become more clearly apparent on reading the following description. This is purely illustrative and must be read in conjunction with the appended drawings in which:

FIG. 6.1 illustrates by way of example a time profile of the power density transferred to the film, during a light pulse;

FIG. 6.2 illustrates by way of example, for CIGS, pairs of durations (abscissae) and average illumination power densities (ordinates) enabling a film to be at least partially crystallized without degrading it;

FIG. 9 illustrates an example of sulfur deposition on a 30×30 $cm^2$ CIGS/Mo/glass substrate in a horizontal reactor;

FIG. 10.1 illustrates the effective sulfur thicknesses, measured by X-ray fluorescence, in the case of a 30×30 $cm^2$ CIGS/Mo/glass substrate; and FIG. 10.2 illustrates the variation in the degree of sulfurization of the films after annealing, as a function of the deposited sulfur thicknesses, in the case of a 30×30 $cm^2$ CIGS/Mo/glass substrate.

DETAILED DESCRIPTION OF THE PREFERRED EMBODIMENTS

Figure 1:
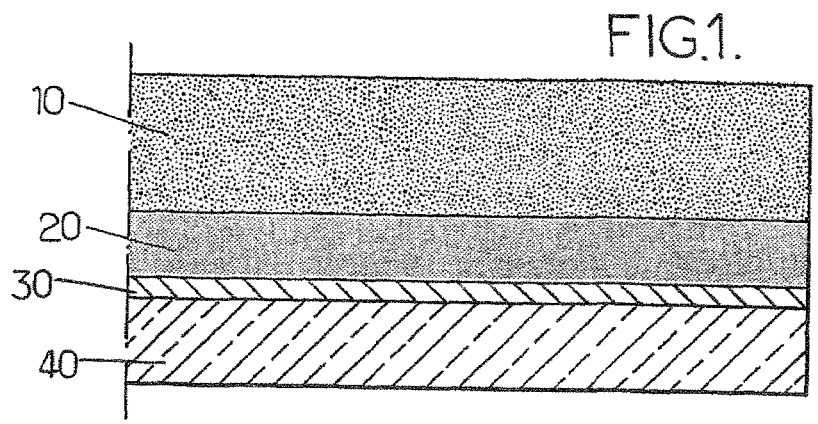
FIG. 1 is a sectional view of a thin CIGS film on which a film containing at least sulfur has been deposited using the process according to the invention.
Figure 2:
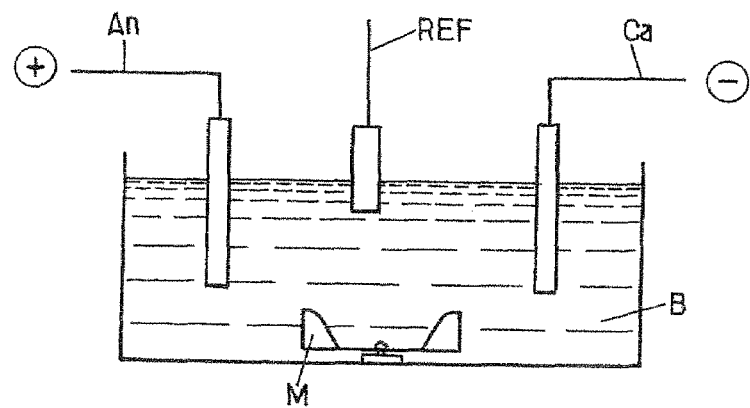
FIG. 2 shows schematically an installation for depositing, electrochemically, a thin CIGS film.
Figure 3:
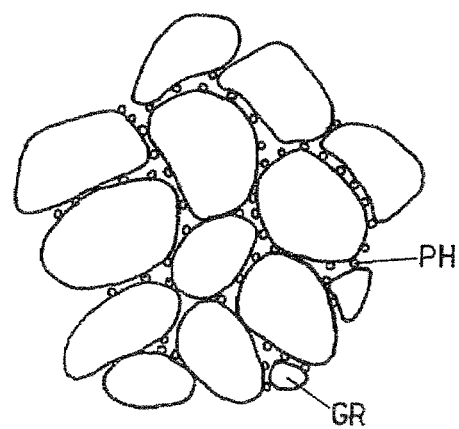
FIG. 3 shows schematically the appearance of the structure in the form of a nanoscale precursor before annealing.
Figure 7:
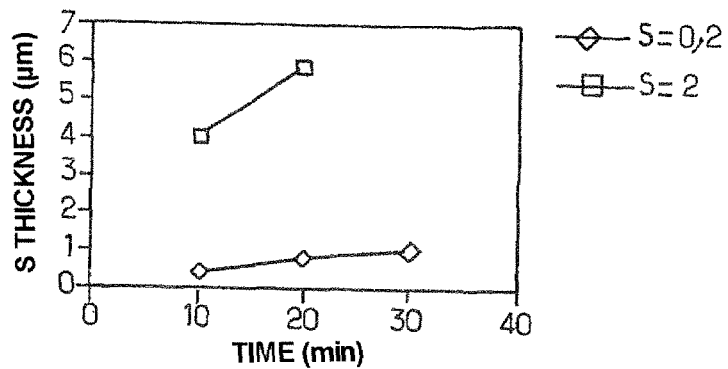
FIG. 7 illustrates the thickness of sulfur deposited by chemical bath deposition, measured by XRF (X-ray fluorescence), as a function of the deposition time and level of acidification of the thiosulfate solutions.

Step a) of the fabrication process according to the invention comprises the deposition of a heterostructure comprising a thin film of substantially amorphous I-III-$VI_2$ precursor, corresponding to the FIGS. 1 to 3, and a thin film including at least sulfur, illustrated in FIG. 7. The deposition of the thin precursor film will be described first.

FIG. 1 is a sectional view of a thin CIGS film on which a film containing at least sulfur has been deposited using the process according to the invention. The sulfur film 10 is deposited on the surface of the CIGS precursor 20. The latter was deposited by electrolysis on a substrate 40, for example a glass substrate, coated with a conducting film 30, for example a molybdenum film, in order to promote the electrolysis and deposition of the CIGS precursor 20.

The deposition of the precursor film may be carried out by techniques known to those skilled in the art. For example, depositions of the CIGS precursor by screen printing may be envisioned. The film may also be deposited using the process described in the application WO 03/094246, as used below.

Figure 5:
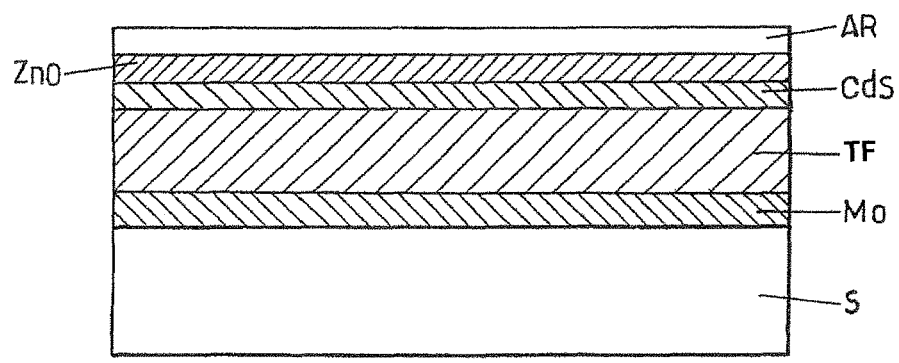
FIG. 5 shows schematically the thin-film structure of a cell intended for photovoltaic application.

Thin films of CIGS precursor were obtained at ambient temperature and pressure by electrodeposition of a TF film on a glass substrate S coated before with molybdenum Mo (FIG. 5). Advantageously, the substrate S is initially coated with an additional, electronically conducting film, for example a metal film or a film in oxide form (not shown). This conducting film may furthermore rest on one or more subfilms serving for a specific application (diffusion barrier, mirror or the like) in the production of photovoltaic cells.

Referring to FIG. 2, the electrodeposition is carried out in a bath B containing, in dissolved form, an indium salt, a copper salt and selenium oxide. To obtain a thin CIGS film, the general composition of which corresponds substantially to $CuGa_xIn_{1-x}Se_2$ (where x is between 0 and 1), it will be understood that the bath may furthermore contain a gallium salt. In an even more sophisticated variant, sulfur salts (for example a sulfite or a thiosulfate) may be added to the solution so as to deposit a composition close to $CuGa_xIn_{1-x}Se_{2-y}S_y$, (where x is between 0 and 1 and y is between 0 and 2). The salts are mixed during deposition by a rotary stirrer M (or a comb stirrer) immersed in the electrochemistry bath B. The configuration in FIG. 2 shows the bath being stirred by a bar magnet. For large-area application, it may be advantageous to replace this system with an oscillating-rod ("comb") stirrer.

Thus, the thin film is obtained by electrodeposition of a precursor, the constituent elements of which are intimately premixed. The concentrations of the precursor elements (in the form of salts and oxides in solution) are between $10^{-4}$ and $10^{-1}$ mol/l. Preferably, the pH of the solution is fixed between 1 and 4. The potential applied to the molybdenum electrode (cathode Ca) is between −0.8 V and −1.9 V relative to the reference electrode REF, here mercurous sulfate (−0.65 V vs the standard hydrogen electrode).

Thin films with a thickness between 0.1 and 3 μm were deposited with current densities of about 0.5 to 4 $mA/cm^2$.

By way of non limiting example, a precursor is deposited from a bath having the following concentrations: $[Cu(SO_4)]=1.0\times10^{-3}$ mol/l; $[In_2(SO_4)_3]=6.0\times10^{-3}$ mol/l; $[H_2SeO_3]=1.7\times10^{-3}$ mol/l; and $[Na_2(SO_4)]=0.1$ mol/l. The pH of the bath is 2 in this example. The precursors are deposited by the cathode reaction at fixed potential, preferably −1 V, relative to the mercurous sulfate reference electrode. The current density is −1 $mA/cm^2$.

Provided that the copper and indium and/or gallium salts, and also the dissolved selenium oxide, are mixed in the solution of the bath B, what is obtained at the end of the aforementioned electrodeposition step is a precursor whose elements are intimately premixed. The precursor film obtained is dense, adherent and of homogeneous morphology. This composition is close to a Cu(25%)/In+Ga(25%)/Se(50%) stoichiometric composition.

The films obtained after the electrodeposition step, as may be seen in FIG. 3, consist of a matrix that is generally amorphous (or low crystallinity compared with the alloy after annealing) but comprising predominantly CIGS grains GR (crystallites of the order of several tens of nanometers in size).

The term "nanograins" is understood to means grains of alloys which, advantageously, have predominantly a physicochemical nature close to that of the intended alloy after annealing and which may have a size of up to a few tens of nanometers.

The cluster of grains within the film therefore forms an advantageously compact matrix capable of withstanding a sudden temperature increase during the annealing step.

The term "matrix" is understood to mean a composite nature of the film capable of having several possible phases PH: a ternary phase (in the case of CIGS); a binary phase (for example $CU_xSe$, where x is close to 2, and $In_xSe_y$, where x is close to 2 and y is close to 3) or even an elemental phase (selenium). The grains GR have a composition close to that desired for the final alloy, for example $CuInSe_2$ in the case of CIGS. In the film, the volume occupied by the grains GR nevertheless remains substantially larger than that occupied by these phases PH.

When the thin CIGS films are deposited at low temperature (precursor deposition), they have a low crystallinity or are even close to amorphous, and the films have to be annealed, by supplying heat, in order for the CIGS crystallization and the charge transport properties to be satisfactorily improved. This annealing corresponds to step b) of the process and will be described later. However, additional partial pre-annealing may be provided between step a) and step b) so as to initiate partial crystallization of the thin precursor film.

In a second phase of step a) of the process according to the invention, a thin film containing at least sulfur is deposited. In a preferred embodiment, it has a common interface with the CIGS precursor film. In a further embodiment, it is deposited directly on the CIGS precursor film. During the annealing of step b), this sulfur will diffuse into CIGS crystal sites in the thin CIGS film so as to replace selenium atoms.

Various techniques exist for depositing the thin film that includes this sulfur. In particular, this thin film may be deposited by CBD (chemical bath deposition). This type of deposition will be described below.

A solution containing thiosulfate ions $S_2O_3^{2-}$ is acidified so as to form elemental sulfur by dismutation of the sulfur initially in oxidation state +II to sulfur 0 and sulfur +IV according to the following reaction:

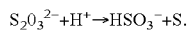

$$S_2O_3^{2-}+H^+\rightarrow HSO_3^-+S.$$

The precursors used are $Cu(In,Ga)Se_2$ or $CuInSe_2$ precursors deposited by electrodepostion on molybdenum-coated glass substrates, as described above.

A 0.1M solution of sodium thiosulfate $Na_2S_2O_3$ is prepared and heated to 70° C. with stirring. Other salts may be used, such as lithium, potassium or ammonium salts. The CIGS/Mo/glass substrates are placed horizontally in the reactor (beaker or crystallizer). The reactor is placed on a hot plate and the sodium thiosulfate solution is then poured on to the precursors. The volume of the solution used depends on the number of substrates to be treated. The height of solution above the substrates is typically 1 cm.

Starting with a concentrated (for example 10M) solution, the volume of an acid solution, for example a hydrochloric acid solution, corresponding to a preferably equimolar mixture of protons $H^+$ and thiosulfate ions $S_2O_3^{2-}$, is then added. The solution immediately goes cloudy. Typically yellow sulfur colloids may then form. The solution is maintained at a temperature between 0 and 70° C., preferably between 40 and 70° C. After a certain deposition time, the substrates are removed from the solution, rinsed with deionized water, and dried with argon or nitrogen.

Yellow sulfur deposits are obtained. These deposits are homogeneous and covering. The sulfur thicknesses deposited are typically a few microns. They depend on the deposition time (immersion time), on the concentration of the thiosulfate solution and also on the degree of acidification of the thiosulfate solution. FIG. 7 shows the thickness of sulfur deposited by CBD, the thickness being measured by XRF, as a function of the deposition time and of the degree of acidification of the thiosulfate solution (the ratio of proton concentration to thiosulfate ion concentration in the final solution). Typical deposition times may vary between 1 minute and 30 minutes, depending on the desired degree of sulfurization (i.e. the proportion of sulfur) after annealing. A surface film containing at least sulfur is thus deposited on the thin CIGS precursor film. Unlike the known techniques, in which the homogeneity of the sulfur pressure during annealing depends on the position of the powdered sulfur source or on the hydrodynamic regime of the $H_2S$ flow in the chamber, this homogeneity depends, in the case of CBD only on the temperature homogeneity of the substrate during annealing.

The thickness of the deposits is several microns—for thicker deposits, these are characterized by a deposition time of 30 minutes. Moreover, the sulfur deposits are preferably composed of only sulfur. They may contain species coming from the chemical bath (oxygen, sodium). However, their quantity is typically less than 1%.

The S/CIGS/Mo/glass substrates are then annealed by a thermal annealing process. Such processes are known to those skilled in the art, as for example in patent application WO 03/094246 relating to rapid thermal processing, and adopted hereafter.

Various types of thermal annealing may be used. Rapid thermal annealing is used in one advantageous method of implementing the process according to the invention, an example of which will be described below.

Figure 4:
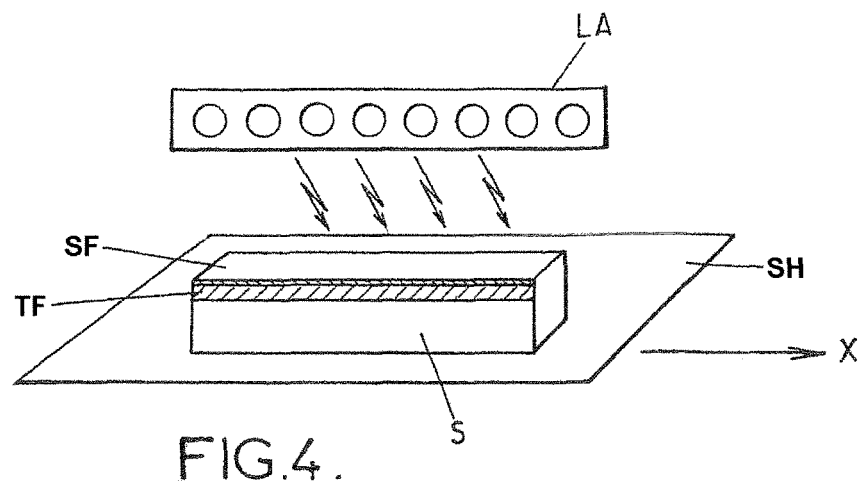
FIG. 4 shows a rapid annealing installation, for illuminating the thin film obtained by electrodeposition.

The heat treatment may be carried out by rapidly annealing the electrodeposited precursor thin film TF and the thin film SF containing at least sulfur. As shown in FIG. 4, the films TF and SF, together with the substrate S, are placed on a specimen holder SH. The latter is preferably capable of being moved in a horizontal plane (displacement along the axis X, as shown in FIG. 4) relative to a light source LA. In the example described, this source is a row of halogen lamps of high radiation power, advantageously in an optical absorption band of the films TF and SF. Thus, it would be understood, in the example described, that "rapid annealing" means illuminating the films TF and SF so as to allow the sulfur of the surface film to diffuse into the electrodeposited thin precursor film, and to allow the precursor to crystallize, for total times of the order of ten seconds to a few tens of seconds. This rapid annealing is carried out in an oven fitted with lamps (FIG. 4) in which the thin film may receive, by direct incidence, radiated power levels of around 5 W/cm² and higher. As a variant, the rapid annealing may be provided by induction heating using a current loop.

One current interpretation of the effect of the annealing is the following. The energy transferred to the thin film during rapid annealing makes the VI elements (Se and S), which have low melting points, active, thereby initiating the aggregation of the grains GR, as in the case of sintering. The nanograins GR in the precursor join up to form coarser grains, of substantially micron size. At higher temperature (>500° C.), the binary phases of the copper/selenium type, which may also be present in the precursor film, may themselves melt and also contribute to the crystallization mechanisms. During rapid annealing, the excess VI elements and the copper/selenium binary phases play an important role of recrystallizing and passivating the defects.

Advantageously, the annealing operations may be carried out at atmospheric pressure under the pressure of an inert gas (for example argon or nitrogen). In this way the rate of evaporation of the excess VI elements is limited, leaving more time for the recrystallization effect. In the example described, the maximum power per unit area that the thin film actually receives is estimated to be 25 W/cm$^2$, taking into account the nominal power of the lamps, the dispersion of the light between the lamps and the thin film, the reflection losses, and other factors.

FIG. 6.1 shows a pulse with a maximum power, applied for three seconds. However, the pulse shows a leading edge and a trailing edge in the light power delivered as a function of time, due to the inertia of the lamps. Nevertheless, experience shows that such pulses already allow sulfur to diffuse and the thin CIGS film to crystallize so as to obtain good photovoltaic properties.

FIG. 6.2 shows experimental points (dark squares) corresponding to average light power/annealing duration pairs that allow crystallized films to be obtained. The aforementioned three-second pulse corresponds to the first point on the left in the graph. The regions A, B and C, bounded by dotted curves, correspond respectively to:

power/duration pairs for which the power is too high (region A)—the film is liable to be degraded during annealing;

power/duration pairs allowing satisfactory crystallization of the film to be achieved (region B); and power/duration pairs for which the power is insufficient for the film to be correctly annealed (region C).

Typically for a film thickness of about one micron deposited on a glass substrate, the power transferred to the film is greater than a few watts per cm$^2$ (W/cm$^2$) in order to start satisfactory crystallization. Advantageous annealing is obtained for a transferred power of typically greater than 5 W/cm$^2$, and preferably 10 W/cm$^2$, over a duration of less than 30 seconds. Advantageous annealing is also achieved for a power greater than 15 W/cm$^2$ over a duration of less than a few tens of seconds. The power levels needed in general of the order of a few W/cm$^2$.

After annealing, the thin film TF is advantageously recrystallized in a manner substantially equivalent to or better than, what is obtained after conventional annealing operations at temperatures above 450° C. and for times close to one hour.

Thus according to one of the advantages afforded by the present invention, the premixed structure of the electrodeposited precursor is by nature favorable for the recrystallization process, however with much shorter times than those of conventional annealing operations.

The rapid thermal annealing is typically carried out for durations of less than or of the order of a few tens of seconds. These sufficiently short durations allow sulfur to diffuse substantially into the CIGS film, and enable the desired composition in the thin semiconductor alloy film to be obtained, in order thus to give it photovoltaic properties, and especially an adjusted bandgap width.

Figure 8:
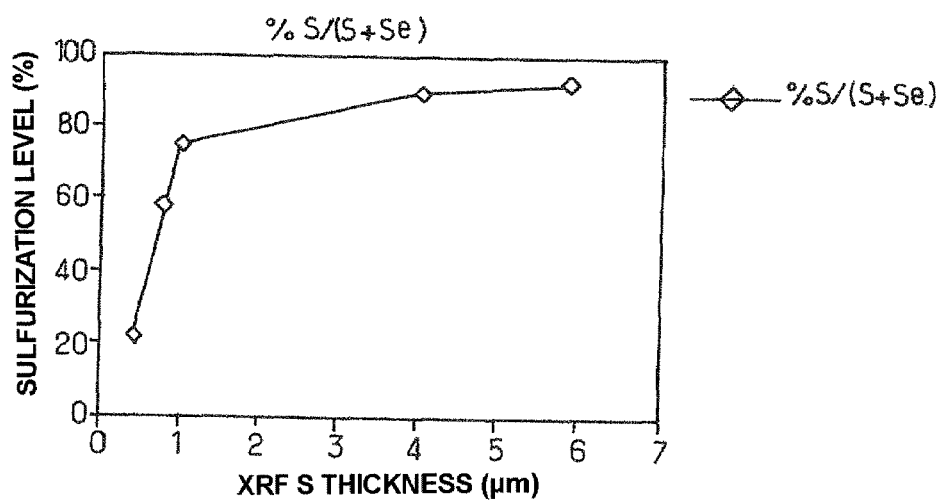
FIG. 8 illustrates the variation in the degree of sulfurization of the films after annealing, as a function of the sulfur thicknesses deposited.

During the annealing, the sulfur atoms coming from the sulfur film deposited by chemical bath deposition replace the selenium atoms of the CIGS film. The degree of substitution of the selenium atoms with sulfur atoms (or degree of sulfurization) within the CIGS film (i.e. y=S/(S+Se)) depends on the amount of sulfur available, and therefore on the relative thickness of the film including at least the sulfur (said film for example being deposited by chemical bath deposition). The proportion of sulfur in the alloy after annealing is therefore controlled according to the relative thickness of the film including sulfur (FIG. 8). The expression "relative thickness of the film including sulfur" is understood to mean the thickness of this film relative to the thickness of the CIGS precursor film.

The higher this degree of substitution, the wider the bandgap of the absorber after annealing, having the approximate formula Cu(In$_x$,Ga$_{1-x}$)(S$_y$Se$_{1-y}$)$_2$, in which 0≤x≤1 and 0≤y≤1. The bandgap width is adjusted according to the proportion of sulfur, and consequently according to the thickness of the film 10.

The precursor films after the deposition step have only poor photovoltaic properties in this state. In fact, these photovoltaic properties are obtained only after a thermal annealing treatment, which also promotes diffusion of sulfur into the precursor. The crystallization of the thin film allows good p-type transport properties for photovoltaic conversion to be obtained.

By controlling the amount of sulfur deposited by chemical bath deposition, and therefore available for sulfurization during annealing, it is therefore possible to control the width of the bandgap.

After rapid thermal annealing, various levels of sulfurization are obtained depending on the thickness of the sulfur deposit produced by chemical bath deposition. The levels of sulfurization vary from a few percent (%) to 100% (FIG. 8). It should be noted that high levels of sulfurization are obtained both for copper-rich absorbers and also for indium-rich absorbers, which have nevertheless, according to conventional preconceptions, lower sulfur diffusion coefficients.

It thus appears to be possible, depending on the thickness of sulfur deposited by CBD, that is to say depending on the relative thickness of the film including sulfur, to control the level of sulfurization (proportion of the sulfur) of the absorbers after annealing and consequently to adjust the width of the bandgap. The open-circuit voltages vary between 400 and 750 mV depending on the level of sulfurization.

TABLE 1

I-V parameters of cells prepared by the process according to the invention, with various levels of sulfurization after annealing under AM 1.5 simulated illumination

| $y = \dfrac{S}{S+Se}$ | E$_g$ (eV) | I$_{sc}$ (mA/cm$^2$) | V$_{oc}$ (mV) | SA (%) | Eff (%) |
|---|---|---|---|---|---|
| 10.0% | 1.06 | 18.0 | 482 | 56.0 | 4.9 |
| 62.1% | 1.29 | 20.7 | 621 | 60.4 | 7.8 |
| 86.4% | 1.43 | 19.2 | 764 | 66.0 | 9.7 |

In this table:
E$_g$ is the gap or bandgap width in eV;
I$_{sc}$ is the short-circuit current in mA/cm$^2$
V$_{oc}$ is the open-circuit voltage in mV;
SA is the aspect ratio; and
Eff is the conversion efficiency.

This method of sulfurization may be coupled with the selenization method given below. It is in fact possible to produce S and/or Se deposits by chemical bath deposition. These S/Se structures may allow perhaps the sulfurization of the CIGS films to be optimized while preventing the CIGS films from being too rapidly depleted in selenium during the first temperature rise steps.

Another major advantage of the fabrication process according to the invention is that it can be easily extrapolated to large areas. In particular, sulfur deposition by CBD has been carried out on substrates measuring 30×30 cm$^2$, as illustrated in FIG. 9. Sulfur was deposited on CIGS/Mo/glass substrates 230 measuring 30×30 cm$^2$ in a horizontal reactor 210, it being possible to minimize the amount of chemical bath 220.

The effective thickness of the sulfur films is measured by X-ray fluorescence. This may vary from a few nanometers to several microns depending on the conditions. However, the homogeneity of the deposit was checked over an area of 30×30 cm$^2$, as illustrated in FIG. 10.1 for a sulfur surface film deposited by the process according to the invention; the dispersion in the thicknesses of this film is less than 5% (between 7.5 and 8.0 µm over the 30×30 cm$^2$ substrate)$^2$.

FIG. 10.2 illustrates, on these same 30×30 cm$^2$ substrates, the correlation that may exist between the sulfur thickness deposited by the process according to the invention before annealing and the level of sulfurization of the films after annealing. Within the range explored, the level of sulfurization does not seem to depend on the sulfur thickness deposited by CBD: the system is certainly beyond saturation. However, it should be noted that this saturation plateau certainly depends on the experimental conditions, such as the composition of the CIGS precursor before annealing, the form of the annealing, etc.

It is possible in the same way to deposit an element of selenium film by CBD on the surface of CIGS precursors electrodeposited with or without the surface sulfur film. This is because it is well known that the quality of recrystallization of the CIGS films during annealing is very dependent on the partial Se pressure during this step. The Se atmosphere is in principle generated by evaporating elemental Se and/or by introducing H$_2$Se. The surface film deposited directly on the precursor in addition to containing at least sulfur, also contains in this case selenium.

The present invention solves the same problems as in the case of sulfur, namely heterogeneities due to solid Se and toxicity due to hydrogen selenide.

The principle of the invention is to dissolve elemental Se in a sulfite (SO$_3^{2-}$) or a disulfite (S$_2$O$_5^{2-}$) medium in order to form SeSO$_3^{2-}$ or SeS$_2$O$_5^{2-}$ complexes respectively. The Se is released by acidifying the reaction medium, which causes controlled precipitation of elemental Se.

The complexing anion seems to play an important role. The initial studies have shown that selenium is deposited more easily with disulfite ions S$_2$O$_5^{2-}$ rather than with sulfite ions SO$_3^{2-}$.

Unlike the thiosulfate complexes S$_2$O$_3^{2-}$, from which sulfur deposits form on the surface of CIGS films, the selenosulfate complexes SeSO$_3^{2-}$ do not seem to give adherent selenium deposits, even though there is selenium precipitation in solution after acidification. However, trials with SeS$_2$O$_5^{2-}$ complexes have proved to be more conclusive.

A 0.1M solution of sodium disulfite Na$_2$S$_2$O$_5$ is prepared and heated at 40-90° C. with stirring. This preparation may possibly be carried under reflux for temperatures close to 100° C. The pH of the solution is brought to a basic pH, preferably 10, by the addition of an additive such as sodium hydroxide NaOH. A small amount of gray elemental selenium, preferably less than or equal to 0.05 mol/l is added in powder form to the solution. The solution is stirred until complete dissolution (about one hour).

The solution prepared above is then poured onto the CIGS specimens in a reactor. The volume of solution used depends on the number of substrates to be treated. The chemical bath deposition of the additional selenium-rich thin film is carried out within temperature ranges between 0° C. and 80° C. The height of solution above the substrates is typically 1 cm. Starting with a concentrated (e.g. 10M) solution, the volume of an acid solution, for example a hydrochloric acid solution, corresponding to a preferably equimolar mixture of protons H$^+$ and disulfite ions S$_2$O$_5^{2-}$, is then added. Selenium colloids then form. The solution immediately goes cloudy and takes on a typical claret color. After a certain deposition time, the substrates are removed from the solution, rinsed with deionized water, and dried with argon. If the solution is maintained between 50 and 70° C. during selenium deposition, the deposits obtained are black (hexagonal crystal form of Se). If the deposition is carried out at room temperature, the deposits obtained are orange-red (red: amorphous form of Se; orange: monoclinic α or β crystal form).

The deposits are homogeneous and covering. The thickness of the selenium deposits obtained, which may range up to a few microns, depends on the deposition time during which the substrates were left in the solution and on the initial concentration of the mother liquor. Typical deposition times vary between one minute and sixty minutes depending on the desired degree of selenization during annealing.

The selenium remaining in solution is deposited on the bottom of the beaker and can be recycled for the next deposition. There is therefore no loss of selenium during selenium deposition by chemical bath deposition.

The thin selenium rich-film is advantageously deposited between the precursor and the sulfur film in order to limit exodiffusion of selenium during annealing step b).

By supplying a selenium-rich additional thin film it is also possible to control the bandgap width according to the thickness and the relative proportion of the selenium film.

Thus, it is possible to produce thin films deposited on the thin CIGS precursor film that have, in alternation, films that include sulfur and films that include selenium, all these being obtained for example by CBD. It is even possible to envision the simultaneous deposition of a mixed film containing both selenium and sulfur, using a bath containing both selenium and sulfur, in controlled proportions. The annealing step then enables the sulfur and the selenium to diffuse into the thin precursor film. In the case of thin films including both sulfur and selenium, this annealing must be carried out for times of the order of a few tens of seconds or less, which times are short enough for substantially all of the sulfur and selenium to diffuse into the CIGS film.

Whether CBD is used to deposit a thin film including sulfur, a film including selenium or a film including a mixture of the two, the chemical bath may contain a colloidal suspension of sulfur, selenium or a sulfur/selenium mixture, respectively, in a solvent. But of course, the proportions of sulfur and selenium in the colloidal bath are determined according to the desired bandgap width.

To deposit such a film (of sulfur, selenium or a mixture of the two), the chemical bath may alternatively take the form of a solution containing sulfur, selenium or a sulfur/selenium mixture, respectively, dissolved in a solvent. Of course the proportions of sulfur and selenium in the bath are determined according to the desired bandgap width.

The surface films containing at least sulfur also have the advantage during annealing of forming a protective film that limits the evaporation of volatile elements, such as selenium, from the precursor.

In general, the process according to the invention advantageously makes it possible to limit exodiffusion of selenium from the precursor film, and promotes the diffusion of sulfur into the latter. Advantageously, the process makes it possible to obtain a final composition in desired stoichiometric ratios.

The invention claimed is:

1. A process for fabricating thin films of semiconductor I-III-VI$_2$ alloys that include sulfur, for photovoltaic applications, comprising:
  a) depositing a heterostructure comprising a thin film comprising elemental sulfur disposed on a thin precursor film on a substrate by:
    (i) depositing the thin precursor film of substantially amorphous or slightly crystalline I-III-VI$_2$ precursor, wherein the thin precursor film is deposited while mixing constituent elements of the precursor film such that the thin precursor film is deposited with a structure comprising nanograins of alloys joined together by amorphous phases, and (ii) depositing the thin film comprising elemental sulfur on the thin precursor film; and b) annealing the heterostructure to favor diffusion of the sulfur into the thin precursor film and at least partial crystallization of the I-III-VI$_2$ alloy of the precursor film with a stoichiometry thus including sulfur, wherein the sulfur at least partially replaces the element VI of the I-III-VI$_2$ precursor, and wherein the proportion of sulfur in the I-III-VI$_2$ alloy obtained in step b) is controlled at least according to a relative thickness of the thin film comprising elemental sulfur.

2. The process of claim 1, wherein the precursor film is deposited by electrolysis.

3. The process of claim 1, wherein an additional partial pre-annealing step is provided between steps a) and b) so as to initiate partial crystallization of the precursor film.

4. The process of claim 1, wherein the deposition of the thin film including sulfur is carried out in step a) by chemical bath deposition.

5. The process of claim 1, wherein the thin film including sulfur has a common interface with the precursor film.

6. The process of claim 5, wherein the thin film including sulfur is deposited directly on the precursor film.

7. The process of claim 1, wherein the heterostructure is annealed for durations of the order of a few tens of seconds or less and with a power of the order of a few W/cm$^2$.

8. The process of claim 7, wherein a temperature of the heterostructure is raised to 450° C. or higher in step b).

9. The process of claim 8, wherein a power transferred to the heterostructure is greater than 5 W/cm$^2$.

10. The process of claim 9, wherein the power transferred to the film is greater than 10 W/cm$^2$ over a duration of less than 30 seconds.

11. The process of claim 1, wherein, in step a), the substrate and the precursor film are placed in a reactor into which a solution containing thiosulfate ions $S_2O_3^{2-}$ is poured.

12. The process of claim 11, wherein in step a), a volume of acid corresponding to a mixture, preferably equimolar mixture, of protons H$^+$ and thiosulfate ions $S_2O_3^{2-}$ is poured in.

13. The process of claim 12, wherein the thin film is substantially homogeneous thickness-wise within a 5% range over an area measuring 30×30 cm$^2$.

14. The process of claim 1, wherein in step a), at least one selenium-rich additional thin film is also deposited.

15. The process of claim 14, wherein the selenium-rich additional thin film is deposited between the precursor and the thin film, in order to limit exodiffusion of the selenium.

16. The process of claim 15, wherein the selenium-rich additional thin film is produced by chemical bath deposition.

17. The process of claim 16, wherein the selenium-rich additional thin film is prepared from a disulfite solution to which an additive giving it a basic pH is added.

18. The process of claim 14, wherein the deposition of the thin film is carried out in step a) by chemical bath deposition, and wherein the chemical deposition is carried out in a bath containing both selenium and sulfur, allowing a film consisting of a mixture of sulfur and selenium to be deposited in controlled proportions.

19. The process of claim 14, wherein the deposition of the thin film is carried out in step a) by chemical bath deposition, and wherein the chemical bath is a colloidal suspension of sulfur, selenium or a sulfur/selenium mixture in a solvent.

20. The process of claim 14, wherein the deposition of the thin film is carried out in step a) by chemical bath deposition, and wherein the chemical bath is a solution of sulfur, selenium or a sulfur/selenium mixture dissolved in a solvent.

21. The process of claim 1, wherein a bandgap width of the I-III-VI$_2$ alloy obtained in step b) is controlled at least according to a relative thickness of the film including sulfur.

22. The process of claim 21, wherein, in step a), at least one selenium-rich additional thin film is also deposited, and wherein respective proportions of sulfur and selenium in the alloy obtained in step b) and consequently the bandgap width is controlled according to respective thicknesses of the thin film and of the selenium-rich additional thin film.

* * * * *